(12) United States Patent
Lin et al.

(10) Patent No.: US 7,105,879 B2
(45) Date of Patent: Sep. 12, 2006

(54) WRITE LINE DESIGN IN MRAM

(75) Inventors: Wen Chin Lin, Hsih-Chu (TW); Denny Tang, Saratoga, CA (US); Li-shyue Lai, Jhube (TW); Chao-Hsiung Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 77 days.

(21) Appl. No.: 10/827,769

(22) Filed: Apr. 20, 2004

(65) Prior Publication Data

US 2005/0234659 A1   Oct. 20, 2005

(51) Int. Cl.
*H01L 29/76*   (2006.01)

(52) U.S. Cl. ............... 257/295; 257/421; 365/158; 365/171

(58) Field of Classification Search ............ 257/295, 257/421; 365/158, 171
See application file for complete search history.

(56) References Cited

U.S. PATENT DOCUMENTS

| | | | |
|---|---|---|---|
| 6,097,625 A | 8/2000 | Scheuerlein | 365/171 |
| 6,272,041 B1 | 8/2001 | Naji | 365/171 |
| 6,331,943 B1 | 12/2001 | Naji et al. | 365/158 |
| 6,430,084 B1 | 8/2002 | Rizzo et al. | 365/173 |
| 6,960,815 B1 * | 11/2005 | Yoda et al. | 257/421 |
| 2002/0034094 A1 * | 3/2002 | Saito et al. | 365/158 |

* cited by examiner

*Primary Examiner*—VanThu Nguyen
(74) *Attorney, Agent, or Firm*—Duane Morris LLP

(57) ABSTRACT

A magnetic random access memory device (MRAM) and the method for forming the same are disclosed. The MRAM has a magnetic tunnel junction (MTJ) device, a first write line, and a second write line orthogonal to the first write line, wherein at least one of the first and second write lines has a width narrower than that of the MTJ.

17 Claims, 4 Drawing Sheets

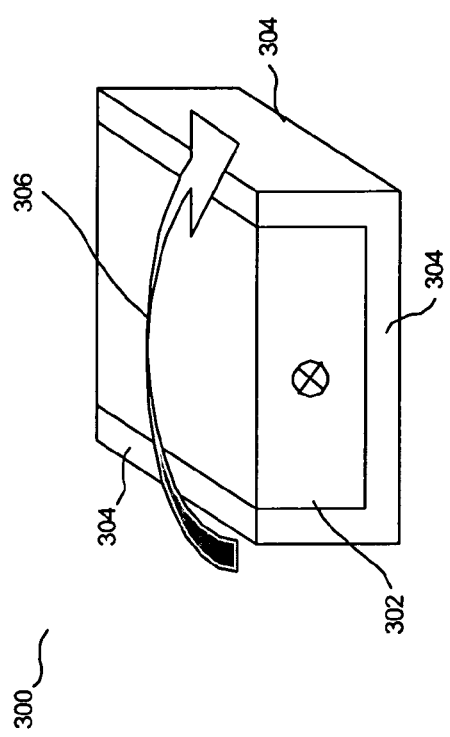
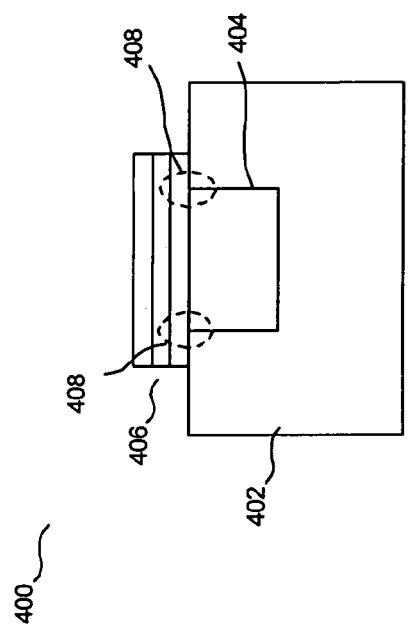
FIG. 3
FIG. 4

WRITE LINE DESIGN IN MRAM

BACKGROUND

The present invention relates generally to non-volatile memories, and more particularly to magnetic random access memories.

Magnetic Random Access Memory (MRAM) is a type of non-volatile memory with fast programming time and high density. The architecture for MRAM includes a plurality or array of memory cells and a plurality of word line and bit line intersections. Typically, the magnetic memory cell used is composed of a magnetic tunnel junction (MTJ) cell, an isolation transistor, and the intersection of word and bit lines. The isolation transistor is generally a N-channel field effect transistor (FET). An interconnect cell connects the isolation transistor to the MTJ device, to the bit line, and to the word line used to create part of the magnetic field for programming the MRAM cell.

Typically, a MTJ cell includes a non-magnetic conductor forming a lower electrical contact, a pinned magnetic layer, a tunnel barrier layer positioned on the pinned layer, and a free magnetic layer positioned on the tunnel barrier layer with an upper contact on the free magnetic layer.

The pinned layer of magnetic material has a magnetic vector that is always pointed in the same direction. The magnetic vector of the free layer is free, but constrained by the physical size of the layer, to point in either of two directions. An MTJ cell is used by connecting it in a circuit such that electricity flows vertically through the cell from one of the layers to the other. The MTJ cell may be electrically represented as a resistor, and the size of the resistance depends upon the orientation of the magnetic vectors. As is understood by those skilled in the art, the MTJ cell has a relatively high resistance when the magnetic vectors are pointed in opposite directions and a relatively low resistance when the magnetic vectors are aligned.

A bit line is generally associated with each column of an array of MTJ cells and a word line is associated with each row of the array. The bit lines and word lines are used to address individual cells in the array for both reading and programming or storing information in the array. Programming of a selected cell is accomplished by passing predetermined currents through the word and bit lines intersecting at the selected cell. For embodiment, the magnetic field resulting from a "write current" changes the direction of the data layer, or free layer. As a result, the data are written as soon as the "write current" is applied.

It is of course desirable to have the low resistance (parallel vectors) as low as possible, and the high resistance (anti-parallel vectors) much higher than the low resistance so that the change can be easily detected in associated electronic circuitry.

Desirable in the art is an improved high density MRAM device.

SUMMARY

In view of the foregoing, this invention provides a method for reducing the area used by MRAM memories.

Various aspects and advantages will become apparent from the following detailed description, taken in conjunction with the accompanying drawings, illustrating the principles of the invention by way of embodiments.

BRIEF DESCRIPTION OF THE DRAWINGS

FIG. 3 illustrates a first enhancement of the MRAM cell design in accordance with one embodiment of the present invention.

FIG. 4A illustrates a conventional technique for constructing a magnetic tunnel junction over a write line.

DESCRIPTION

Figure 1B:
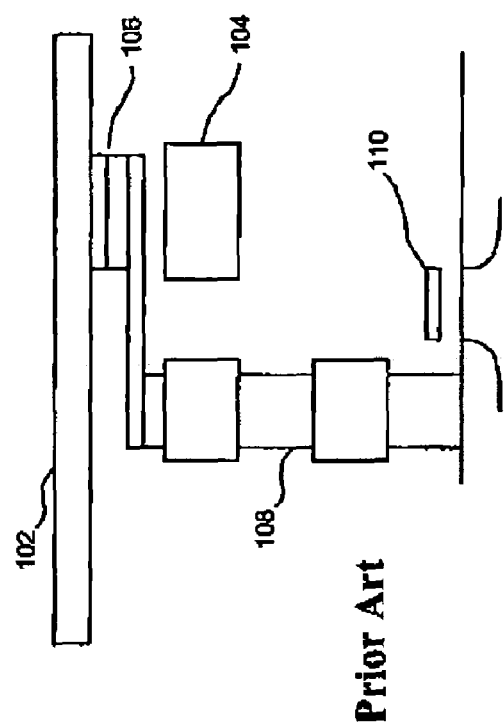
FIG. 1A–1B illustrate the top and side views of a conventional MRAM cell design.
Figure 1A:
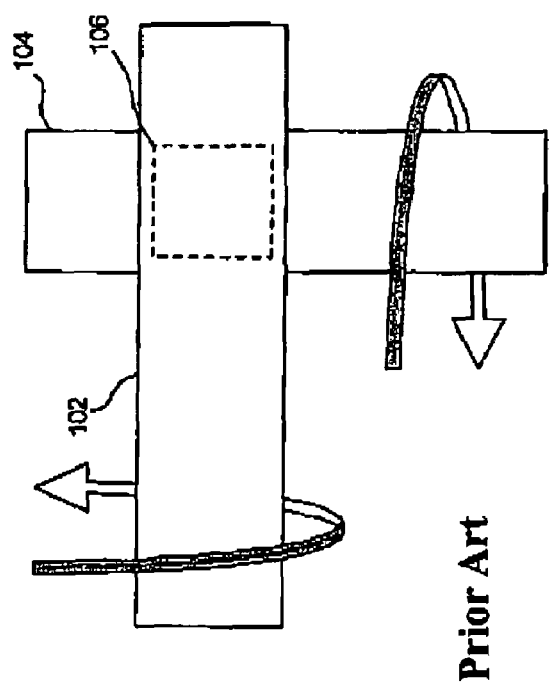

FIGS. 1A and 1B illustrate, respectively, the top and side views of a conventional MRAM cell design. A write line 102 is on top of another write line 104, the latter being separated from and orthogonal to the former by a magnetic tunnel junction (MTJ) cell 106. The MTJ cell 106 is further connected, through an interconnect cell 108, to an N-channel Field Effect Transistor (FET) 110. In this embodiment, since it is assumed that a uniform magnetic field is required to write to the MTJ cell, the widths of write lines 102 and 104 are shown to be larger than the width of MTJ cell 106 to ensure that the magnetic current is properly flipped during a "write" operation.

However, since the width of the write line is inversely proportional to cell density and directly proportional to the magnitude of the "write current", MRAM design may become very costly. In addition, the magnetic flux efficiency also decreases due to a decrease in the write-current density, thereby further reducing performance.

Figure 2B:
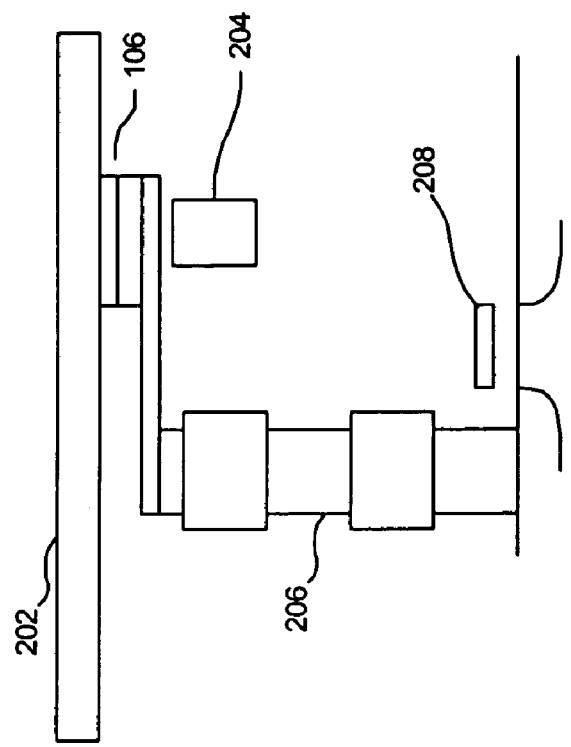
FIG. 2A–2B illustrate the top and side views of an MRAM cell design in accordance with one embodiment of the present invention.
Figure 2A:
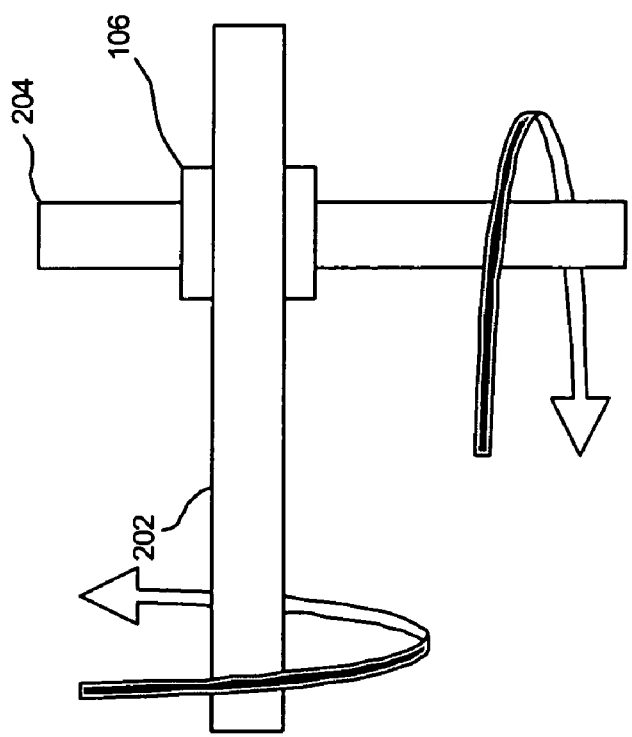

FIGS. 2A and 2B illustrate, respectively, the top and side views of an MRAM cell design in accordance with one embodiment of the present invention. A write line 202 is on top of another write line 204, the latter being separated from the former by the MTJ cell 106. The MTJ cell 106 is further connected, through an interconnect cell 206, to an N-channel Field Effect Transistor (FET) 208. In this embodiment, the both widths of write lines 202 and 204 are shown to be smaller than the width of MTJ cell 106. It is understood that since the MTJ is of a rectangular or even square shape, the term "width" is used to mean the length of any of its sides. Compared to the conventional MRAM cell design, as long as at least one write line has a width smaller than one of the sides of the MTJ cell 106, cell density may be increased and "write current" for that particular write line may be reduced. It is demonstrated that the switching threshold current would not increase when a non-uniform magnetic field is applied. The write lines may be designed as narrow as the minimum design rule for the technology used. However, if the write line is too narrow, it would induce non-uniform magnetic field which may lead to writing error. Preferably, the width of the write line is larger than half of that of the MTJ. In some embodiments, the width of write line is configured between half of the width of the MTJ and the width of the MTJ.

FIG. 3 illustrates a first enhancement of the MRAM cell design in accordance with one embodiment of the present invention. FIG. 3 shows a cross section and top view 300 of a write line, which is constructed with a conductive material 302, integrated with a shielding layer 304 which may include a ferromagnetic cladding layer and an antiferromagnetic layer. The conductive material 302 may be constructed using materials such as Cu or Al, whereas the ferromagnetic material may be constructed using materials such as Fe, Co, Mn, Ni etc. The shielding layer acts as a "keeper layer", thereby acting to focus and strengthen the magnetic field 306 as seen by the MTJ cell. The coated keeper layer may be fabricated by conventional semiconductor processes, including: oxide etching, material deposition and chemical mechanical polishing. As understood by those skilled in the art, the use of the magnetic material 304 as herein proposed may increase or enlarge the magnetic flux efficiency when the write line is conducting. It may allow for not only further reduction of the width of the write lines but also reduction of the write current.

FIG. 4 illustrates a conventional technique for constructing a magnetic tunnel junction over a write line. Specifically, FIG. 4 illustrates a conventional chemical mechanical polish (CMP) fabrication technique for producing the lower conductor line for an MRAM cell. With reference to FIG. 4, a cross section 400 illustrates the patterning of the MTJ cell and the write line. The cross section 400 includes an oxide 402, a conductor 404 and an MTJ cell 406. After CMP, voids may appear at the top edge of conductor line, as illustrated by two dotted circles 408, because removal rates between the conductor and oxide layer may be different.

Figure 5B:
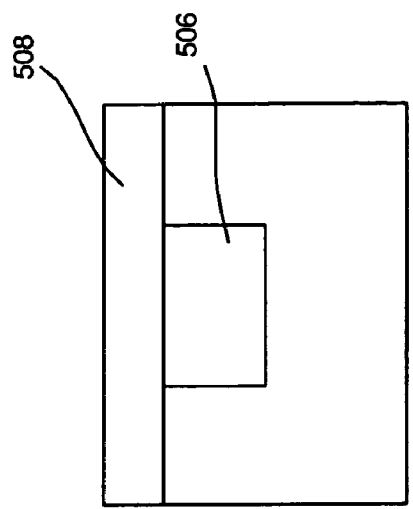
FIGS. 5A–5D illustrate a second enhancement of the MRAM cell design in accordance with one embodiment of the present invention.
Figure 5D:
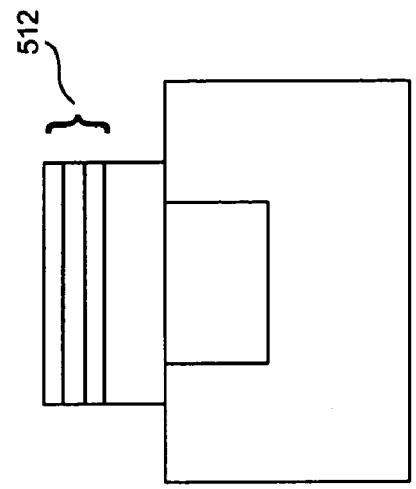
Figure 5A:
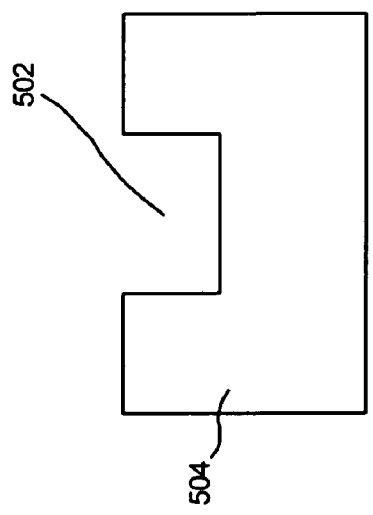
Figure 5C:
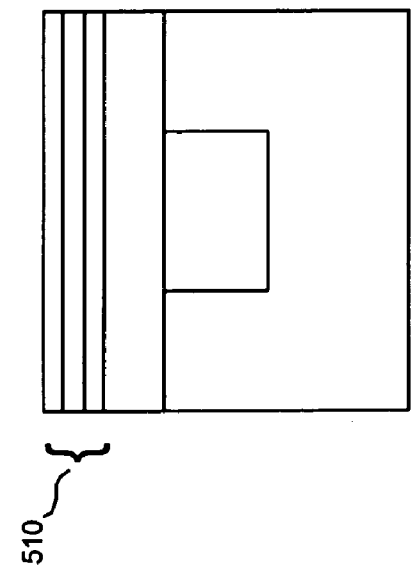

To alleviate the above mentioned problem, a process sequence as illustrated by FIGS. 5A–5D is proposed in accordance with one embodiment of the present invention. With reference to FIG. 5A, a trench 502 is cut into a substrate material 504 such as a dielectric material using photo masking and plasma etching techniques. In FIG. 5B, a filler material 506 for forming the write line is deposited to fill the trench 502, thereby covering the trench opening. Typically, the material 506 is a conductor, e.g. metal. If the write line is to have a magnetic keeper layer, the magnetic material is first deposited in the trench before the conducting filler material is formed. If there is any concern about the connection between the keeper layer and filler material, an adhesion layer may also be formed between them. Another layer of material 508 is then deposited to cover the trench 502. Before the material 508 is deposited, the surface of the conducting material in the trench and the substrate material that it is embedded in may be flattened. It is however understood by those skilled in the art that, dependent upon design and process, the filler material 506 may not be the same as the newly deposited material 508 as long as the conducting write line formed in the trench 502 is in electrical contact with the deposited material 508. At this stage, a partial CMP may then be performed so that the surface is guaranteed to be flat since only one uniform material is involved in the CMP process. In FIG. 5C, various layers of films 510 creating the MTJ cell are deposited as usual. Finally, in FIG. 5D, part of the material deposit 508 and part of the various layers 510 of films creating the MTJ cell are removed, thereby creating an MTJ cell 512.

By introducing the material 508 between the write line 506 and the MTJ cell 512, the material 508 serves as a "buffer layer" to have a full contact with the write line and a flat contact surface with MTJ above. As such, the CMP process only deals with a uniform and ensures that the CMP process will not produce voids significant enough to affect performance.

Since the write line is reduced to be narrower in width than the MTJ cell, the area used by arrays of MRAM memories is reduced. By using a surrounding magnetic material or keeper layer, the MRAM arrays have increased effective magnetic field. In addition, the improved construction method reduces the likelihood of having a defective device caused by an uneven CMP surface of the write line.

The above invention provides many different embodiments, or embodiments, for implementing different features of the invention. Specific embodiments of components, and processes are described to help clarify the invention. These are, of course, merely embodiments and are not intended to limit the invention from that described in the claims.

Although illustrative embodiments of the invention have been shown and described, other modifications, changes, and substitutions are intended in the foregoing invention. Accordingly, it is appropriate that the appended claims be construed broadly and in a manner consistent with the scope of the invention, as set forth in the following claims.

What is claimed is:

1. A magnetic random access memory device comprising:
   a magnetic tunnel junction (MTJ) device having a width;
   a first write line having a first write line width; and
   a second write line orthogonal to the first write line, the second write line having a second write line width,
   wherein the first and second write line widths are smaller than the width of the MTJ, and at least one of the first and second write lines widths is about half the width of the MTJ.

2. The magnetic random access memory device of claim 1 wherein both the first and second write widths are about half the width of the MTJ.

3. The magnetic random access memory device of claim 1 wherein at least one of the first and second write lines has a width larger than half of the width of the MTJ.

4. The magnetic random access memory device of claim 3 wherein the width of the write line that is larger than half of the width of the MTJ is smaller than the width of the MTJ.

5. The magnetic random access memory device of claim 1 wherein at least one of the first and second write lines is integrated with a shielding layer adjacent to the at least one of the first and second write lines.

6. The magnetic random access memory device of claim 5 wherein the shielding layer further includes Mn.

7. The magnetic random access memory device of claim 1 wherein at least one of the first and second write lines is connected to the MTJ through a buffer layer with a flat contact surface.

8. The magnetic random access memory device of claim 7 wherein the contact surface between the buffer layer and the MTJ is formed by using a chemical-mechanical polish process.

9. A magnetic random access memory device comprising:
   a magnetic tunnel junction (MTJ) device;
   a first write line; and
   a second write line orthogonal to the first write line,
   wherein both the first and second write lines are narrower in width than the MTJ.

10. The magnetic random access memory device of claim 9 wherein at least one of the first and second write lines is integrated with a shielding layer adjacent to the at least one of the first and second write lines for enlarging a magnetic flux efficiency when conducting a current therein.

11. The magnetic random access memory device of claim 10 wherein the shielding layer contains Mn.

12. The magnetic random access memory device of claim 9 wherein the width of at least one of the first and second write lines is larger than about half the width of the MTJ.

13. The magnetic random access memory device of claim 12 wherein the width of the write line larger than half of the width of the MTJ is smaller than about 75% of the width of the MTJ.

14. The magnetic random access memory device of claim 9 wherein at least one of the first and second write line is connected to the MTJ through a buffer layer with a flat contact surface.

15. The magnetic random access memory device of claim 14 wherein the contact surface between the buffer layer and the MTJ is formed by using a chemical-mechanical polish process to ensure its flatness.

16. The magnetic random access memory device of claim 5, wherein the shielding layer further includes ferromagnetic materials.

17. The magnetic random access memory device of claim 5, wherein the shielding layer further includes antiferromagnetic materials.

* * * * *

UNITED STATES PATENT AND TRADEMARK OFFICE
CERTIFICATE OF CORRECTION

| | |
|---|---|
| PATENT NO. | : 7,105,879 B2 |
| APPLICATION NO. | : 10/827769 |
| DATED | : September 12, 2006 |
| INVENTOR(S) | : Wen Chin Lin et al. |

It is certified that error appears in the above-identified patent and that said Letters Patent is hereby corrected as shown below:

Column 4, line 23, delete "lines" and insert therefore -- line --.

Signed and Sealed this

Thirty-first Day of July, 2007

JON W. DUDAS
*Director of the United States Patent and Trademark Office*